United States Patent
Wang et al.

(10) Patent No.: US 10,643,843 B2
(45) Date of Patent: May 5, 2020

(54) FILM FORMING METHOD AND ALUMINUM NITRIDE FILM FORMING METHOD FOR SEMICONDUCTOR APPARATUS

(71) Applicant: BEIJING NAURA MICROELECTRONICS EQUIPMENT CO., LTD, Beijing (CN)

(72) Inventors: Jun Wang, Beijing (CN); Boyu Dong, Beijing (CN); Bingliang Guo, Beijing (CN); Yujie Geng, Beijing (CN); Huaichao Ma, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 370 days.

(21) Appl. No.: 15/691,211

(22) Filed: Aug. 30, 2017

(65) Prior Publication Data
US 2017/0365466 A1    Dec. 21, 2017

Related U.S. Application Data

(63) Continuation of application No. PCT/CN2016/100799, filed on Sep. 29, 2016.

(30) Foreign Application Priority Data

Jun. 12, 2016 (CN) .......................... 2016 1 0407507

(51) Int. Cl.
*C23C 14/34* (2006.01)
*H01L 21/02* (2006.01)
(Continued)

(52) U.S. Cl.
CPC .... *H01L 21/02631* (2013.01); *C23C 14/0036* (2013.01); *C23C 14/0617* (2013.01);
(Continued)

(58) Field of Classification Search
CPC ............ C23C 14/0036; C23C 14/0617; C23C 14/0641; C23C 14/34; C23C 14/3485; C23C 14/564
(Continued)

(56) References Cited

U.S. PATENT DOCUMENTS 5,232,571 A * 8/1993 Braymen ............ C23C 14/0073
204/192.15
5,571,603 A * 11/1996 Utumi ..................... C30B 23/02
428/212
(Continued)

FOREIGN PATENT DOCUMENTS

CN    101005098 A    7/2007
CN    102299265 A    12/2011
(Continued)

OTHER PUBLICATIONS

The World Intellectual Property Organization (WIPO) International Search Report for PCT/CN2016/100799 dated Mar. 20, 2017 12 Pages.

*Primary Examiner* — Rodney G McDonald
(74) *Attorney, Agent, or Firm* — Anova Law Group, PLLC

(57) ABSTRACT

The present disclosure provides a film forming method and an aluminum nitride film forming method for a semiconductor device. The film forming method for a semiconductor device includes performing multiple sputtering routes sequentially. Each sputtering routes includes: loading a substrate into a chamber; moving a shielding plate between a target and the substrate; introducing an inert gas into the
(Continued)

chamber to perform a surface modification process on the target; performing a pre-sputtering to pre-treat a surface of the target; moving the shielding plate away from the substrate, and performing a main sputtering on the substrate to form a film on the substrate; and moving the substrate out of the chamber.

20 Claims, 3 Drawing Sheets

(51) Int. Cl.

| | | |
|---|---|---|
| C23C 14/06 | (2006.01) | |
| C30B 29/40 | (2006.01) | |
| C30B 23/02 | (2006.01) | |
| C23C 14/00 | (2006.01) | |
| C23C 14/56 | (2006.01) | |
| H01L 33/00 | (2010.01) | |
| H01L 33/12 | (2010.01) | |
| H01L 33/32 | (2010.01) | |
| H01L 33/06 | (2010.01) | |

(52) U.S. Cl.
CPC .......... *C23C 14/0641* (2013.01); *C23C 14/34* (2013.01); *C23C 14/3485* (2013.01); *C23C 14/564* (2013.01); *C30B 23/025* (2013.01); *C30B 29/403* (2013.01); *H01L 21/0242* (2013.01); *H01L 21/0254* (2013.01); *H01L 21/02458* (2013.01); *H01L 33/007* (2013.01); *H01L 33/06* (2013.01); *H01L 33/12* (2013.01); *H01L 33/32* (2013.01)

(58) Field of Classification Search
USPC .............. 204/192.15, 192.16, 192.17, 192.25
See application file for complete search history.

(56) References Cited

U.S. PATENT DOCUMENTS

| | | | | |
|---|---|---|---|---|
| 5,858,183 A | * | 1/1999 | Wolters | ............... C23C 14/0641 |
| | | | | 204/192.13 |
| 8,454,805 B2 | * | 6/2013 | Wilby | ................. C23C 14/0036 |
| | | | | 204/192.12 |

FOREIGN PATENT DOCUMENTS

| | | |
|---|---|---|
| CN | 102820418 A | 12/2012 |
| CN | 102859670 A | 1/2013 |
| CN | 104246980 A | 12/2014 |
| CN | 104992951 A | 10/2015 |
| TW | 201016885 A | 5/2010 |
| TW | 201038755 A | 11/2010 |
| TW | 201234658 A | 8/2012 |
| TW | 201307601 A | 2/2013 |
| TW | 201341562 A | 10/2013 |
| TW | 201401555 A | 1/2014 |
| TW | 201540852 A | 11/2015 |
| WO | 2008075679 A1 | 6/2008 |
| WO | 2008087930 A1 | 7/2008 |

* cited by examiner

FILM FORMING METHOD AND ALUMINUM NITRIDE FILM FORMING METHOD FOR SEMICONDUCTOR APPARATUS

CROSS-REFERENCES TO RELATED APPLICATION

This is a continuation application of International Application No. PCT/CN2016/100799, filed on Sep. 29, 2016, which claims priority to Chinese Patent Application No. CN 201610407507.8, filed on Jun. 12, 2016. The above enumerated patent applications are incorporated by reference herein in their entirety.

FIELD OF THE DISCLOSURE

The present disclosure relates to a film forming method for a semiconductor device, and particularly relates to an aluminum nitride film forming method for a semiconductor device.

BACKGROUND

Physical vapor deposition (PVD) sputtering process has been widely used in current processes of semiconductor integrated circuits, light emitting diodes (LEDs), solar batteries, displays, and the like. In a chamber of a PVD sputtering apparatus, generally, by connecting a high-power DC power supply to a target, applying power to excite a working gas in the chamber into plasma and attracting ions in the plasma to bombard the sputtering target, material of the target is sputtered off to be deposited on a substrate, such as a wafer. Requirements on process parameters, such as sputtering power, sputtering rate and the like, are generally different in different application fields, but basically, endeavor to improve film quality and film thickness uniformity, and to increase capacity of equipment is continuous.

BRIEF SUMMARY OF THE DISCLOSURE

To solve the above technical problem, one aspect of the present disclosure provides a film forming method for a semiconductor device, in which a film is formed by way of sputtering, and a surface modification process is performed on a target before forming the film. In the method of the present disclosure. By adopting different process parameters in the surface modification processes of different sputtering routes, target has different surface conditions in different sputtering routes, which in turn compensates deviation phenomenon of film uniformity of main sputtering processes of different sputtering routes, thereby improving film quality and film thickness uniformity.

Some embodiments of the present disclosure provide a film forming method for a semiconductor device, including performing multiple sputtering routes sequentially to form films on multi-batch substrates, respectively. Each sputtering route includes: loading a substrate into a chamber and placing the substrate on a carrying base; moving a shielding plate between a target and the substrate; introducing an inert gas into the chamber to perform a surface modification process on the target; performing a pre-sputtering to pre-treat a surface of the target; moving the shielding plate away from between the target and the substrate, and performing a main sputtering on the substrate using the target to form a film on the substrate; and moving the substrate out of the chamber. The surface modification process of the sputtering route performed on an N-th batch of substrate and the surface modification process of the sputtering route performed on a (N+1)-th batch of substrate have at least one different process parameter, where N is a positive integer.

Some embodiments of the present disclosure provide an aluminum nitride film forming method for a semiconductor device, which includes performing multiple sputtering routes sequentially to form aluminum nitride films on multi-batch substrates, respectively. Each sputtering route includes: loading a substrate into a chamber and placing the substrate on a carrying base; moving a shielding plate between a target containing aluminum and the substrate; introducing an inert gas into the chamber to perform a surface modification process on the target containing aluminum; performing a pre-sputtering to pre-treat a surface of the target containing aluminum such that the surface of the target containing aluminum turns into a transition state from an Al-rich state; moving the shielding plate away from between the target and the substrate, introducing an inert gas and a gas containing nitrogen into the chamber, and performing a main sputtering on the substrate using the target containing aluminum to form an aluminum nitride film on the substrate; and moving the substrate out of the chamber. The surface modification process of the sputtering route performed on an N-th batch of substrate and the surface modification process of the sputtering route performed on a (N+1)-th batch of substrate have at least one different process parameter, where N is a positive integer.

In the film forming method for a semiconductor device and the aluminum nitride film forming method for a semiconductor device, multiple sputtering routes as being sequentially performed are used for forming films on multi-batch substrates, respectively. The surface modification process of every sputtering route can remove residues on the surface of the target, and by adopting different process parameters in the surface modification processes of different sputtering routes performed on multi-batch substrates, negative impact on film thickness uniformity (e.g., problem of deviation of film uniformity towards a certain direction) generated by the surface modification processes of the multiple sputtering routes can be compensated, thereby improving film quality, film thickness uniformity and so forth.

BRIEF DESCRIPTION OF THE DRAWINGS

The following drawings are merely example for illustrative purposes according to various disclosed embodiments and are not intended to limit the scope of the present disclosure.

DETAILED DESCRIPTION

Figure 1:
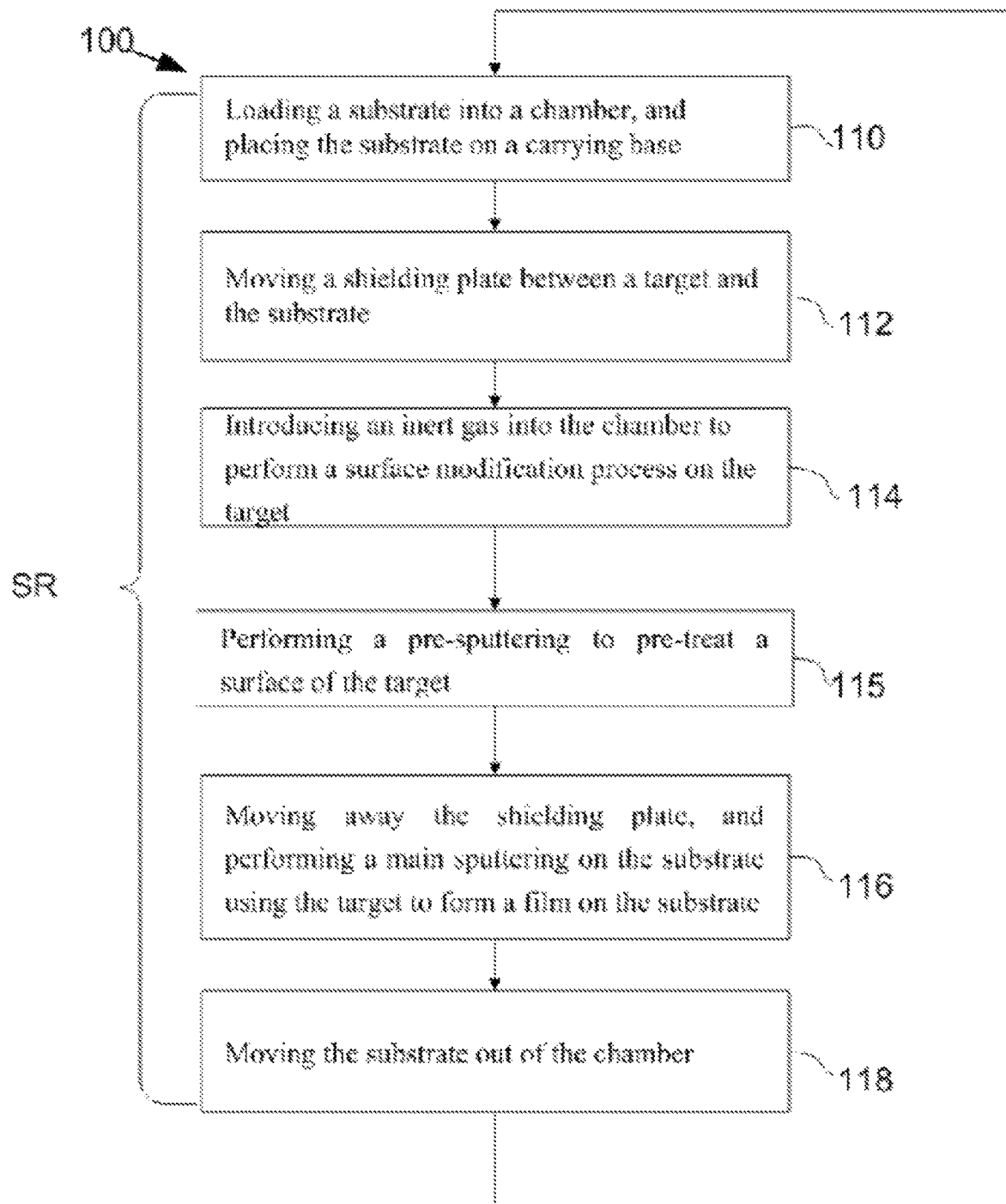
FIG. 1 is a schematic flowchart of a film forming method for a semiconductor device provided in some embodiments of the present disclosure.

Reference will now be made in detail to exemplary embodiments of the disclosure, which are illustrated in the accompanying drawings. Hereinafter, embodiments consistent with the disclosure will be described with reference to the drawings. Wherever possible, the same reference numbers will be used throughout the drawings to refer to the same or like parts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Other embodiments of the disclosure will be apparent to those skilled in the art from consideration of the specification and practice of the disclosure provided herein. It is intended that the specification and examples be considered as exemplary only, with a true scope and spirit of the disclosure being indicated by the claims.

To describe the object, technical solutions and advantages of the present disclosure clearly, a film forming method for a semiconductor device and an aluminum nitride film forming method for a semiconductor device provided by the present disclosure will be explained in detail below in conjunction with the accompanying drawings. It should be understood that specific embodiments described herein are merely used for explaining the present disclosure rather than limiting the present disclosure.

In a manufacturing method of the present disclosure, one sputtering route is used for forming a film on one batch of substrate(s), and a next sputtering route is used for forming a film on a next batch of substrate(s). That is to say, each sputtering route corresponds to one batch of substrate(s). Every batch of substrate(s) refer to all of the substrate(s) processed in one sputtering route, and may be one substrate or a plurality of substrates (e.g., in a case where the tray carries a plurality of substrates simultaneously). Each sputtering route includes, prior to a main sputtering, performing a pre-treatment process on the target, and the pre-treatment process includes performing a surface modification process to remove residues (e.g., a film layer formed on a surface of the target in a previous sputtering route) on the surface of the target, and performing a pre-sputtering to pre-treat the surface of the target, so as to ensure that the target is stable during main sputtering of every sputtering route. For example, in a case where a sputtering is performed using a target containing aluminum to form an aluminum nitride film, performing a surface modification on the target containing aluminum by using an inert gas, such as argon (Ar), can make the surface of the target containing aluminum in an Al-rich state. And a pre-sputtering can change the surface of the target containing aluminum from the Al-rich state into a transition state, so that it can be ensured that the formed aluminum nitride film has good film quality in a subsequent main sputtering. In a practical manufacturing process of aluminum nitride, due to unpredictable factors, it is always noted that thickness distributions of film layers formed in multiple sputtering routes tend to gradually deviate towards a certain direction, and thus the film thickness uniformity is impacted. One possible cause of the foregoing deviation of film thickness distribution uniformity is that some unpredictable factors cause deviation to surface state of the target, and during every sputtering route, such deviation is continuously magnified if no surface modification is performed on the target. It results in deviation of film thickness distribution uniformity to be magnified continuously towards a same direction.

In the film forming method for a semiconductor device of the present disclosure, a surface modification process is performed on the target firstly in every sputtering route, and adopting different process parameters in surface modification processes in different sputtering routes can achieve a compensation effect, which can further alleviate the problem of a serious film thickness uniformity degrading caused by continuous deviation of film thickness distribution towards a same direction.

An aluminum nitride film formed using the method of the present disclosure has good quality, and helps to improve epitaxy quality of a gallium nitride layer that is subsequently formed on the aluminum nitride film. The aluminum nitride film and the gallium nitride layer may be applied in an electronic device, such as a light emitting diode device, and a gallium nitride layer with improved film quality can enhance electrical performance of the electronic device. In addition, an aluminum nitride film having improved thickness uniformity also facilitates stability of mass production of electronic devices.

FIG. 1 is a schematic flowchart of a film forming method for a semiconductor device provided in some embodiments of the present disclosure. As shown in FIG. 1, some embodiments of the present disclosure provide a film forming method 100 for a semiconductor device. The method 100 includes performing a sputtering route SR repeatedly for multiple times to respectively form films on different batches of substrates. Each sputtering route SR includes the following steps 110, 112, 114, 115, 116 and 118. In the present instance, description is given by taking a case where one batch includes one substrate only as an example. In other instances, one batch may include more than one substrates in each sputtering route SR. At step 110, one substrate is loaded into a chamber and placed on a carrying base. At step 112, a shielding plate is moved to a position between a target and the substrate. At step 114, an inert gas is introduced into (e.g., injected into) the chamber to perform a surface modification process on the target. At step 115, a pre-sputtering is performed to pre-treat a surface of the target. At step 116, the shielding plate is moved away from the position between the target and the substrate, and a main sputtering is performed on the substrate using the target to form a film on the substrate. At step 118, the substrate is moved out of the chamber. Next, the method proceeds to perform a next sputtering route SR to form a film on another batch of substrate.

The film forming method for a semiconductor device in the present embodiment includes performing multiple sputtering routes SR sequentially, and each sputtering route SR processes one batch of substrate(s) to form a film on each surface of the batch of substrate(s). The so-called "one batch of substrate(s)" hereinafter refers to all of the substrate(s) processed in each sputtering route SR, and may be one substrate or a plurality of substrates. Besides, the surface modification process of the sputtering route performed on an N-th batch of substrate(s) and the surface modification process of the sputtering route performed on a (N+1)-th batch of substrate(s) have different at least one process parameter, where N is a positive integer. With the provided method of the present disclosure, the problem of continuous deviation of film thickness distribution towards a same direction, resulted from pollution or defect generated on a surface of the target after performing multiple sputtering routes without modification, can be alleviated. further, the film thickness uniformity can be improved. In the present embodiment, the sputtering route performed on the N-th batch of substrate(s) and the sputtering route performed on the (N+1)-th batch of substrate(s) are two successive sputtering routes being performed on different substrates to form films. And the surface modification processes in the two successive sputtering routes have different process parameters. In some embodiments, the process parameters of the surface modification processes in the sputtering routes as performed continuously are adjusted in an alternating manner. That is, the surface modification processes corresponding to odd-numbered sputtering routes may have a same process parameter, and the surface modification processes corresponding to even-numbered sputtering routes may have a same process parameter. However, the surface modification process corresponding to an odd-numbered sputtering route and the surface modification process corresponding to an even-numbered sputtering route have at least one different process parameter. Alternatively, in some other embodiments, process parameters in the surface modification processes corresponding to different sputtering routes may be adjusted in a different manner.

The above method 100 is exemplary only, and the present disclosure is not limited thereto. Other required additional step(s) may be performed before, after and/or in the method 100, and a step in the method 100 may be replaced or omitted, or the order of the steps in method 100 may be changed in other embodiments. In addition, the word "step" used hereinafter is not limited to a single action, and may include one single action, operation or technique, or may be a collection formed by action(s), operation(s) and/or technique(s).

Figure 2A:
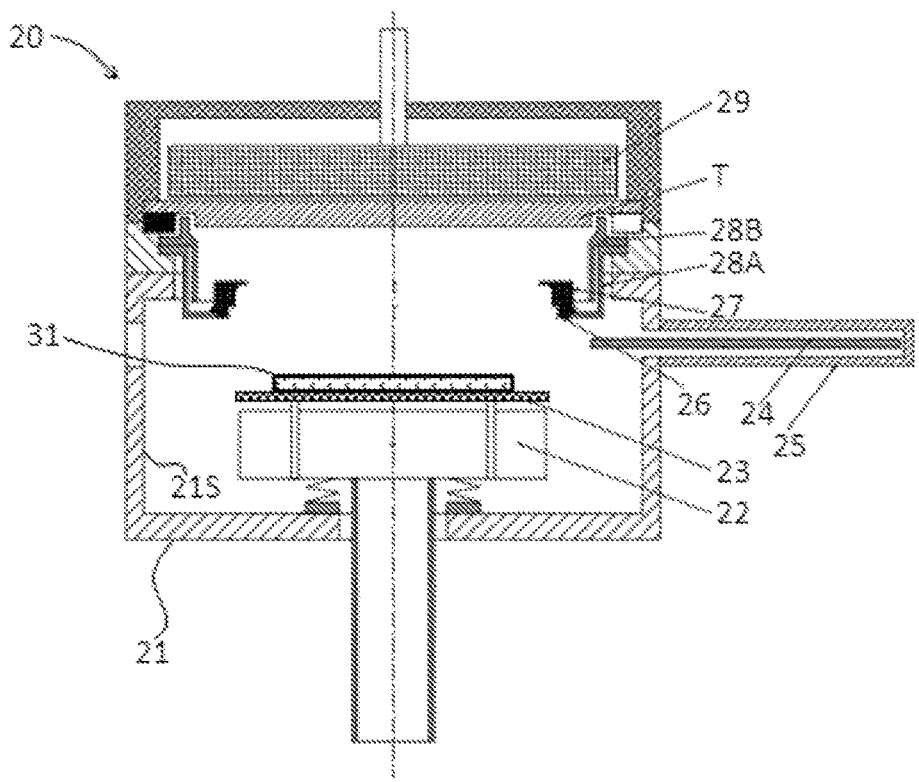
FIG. 2A is a schematic diagram of a film forming method for a semiconductor device provided in some embodiments of the present disclosure.
Figure 2B:
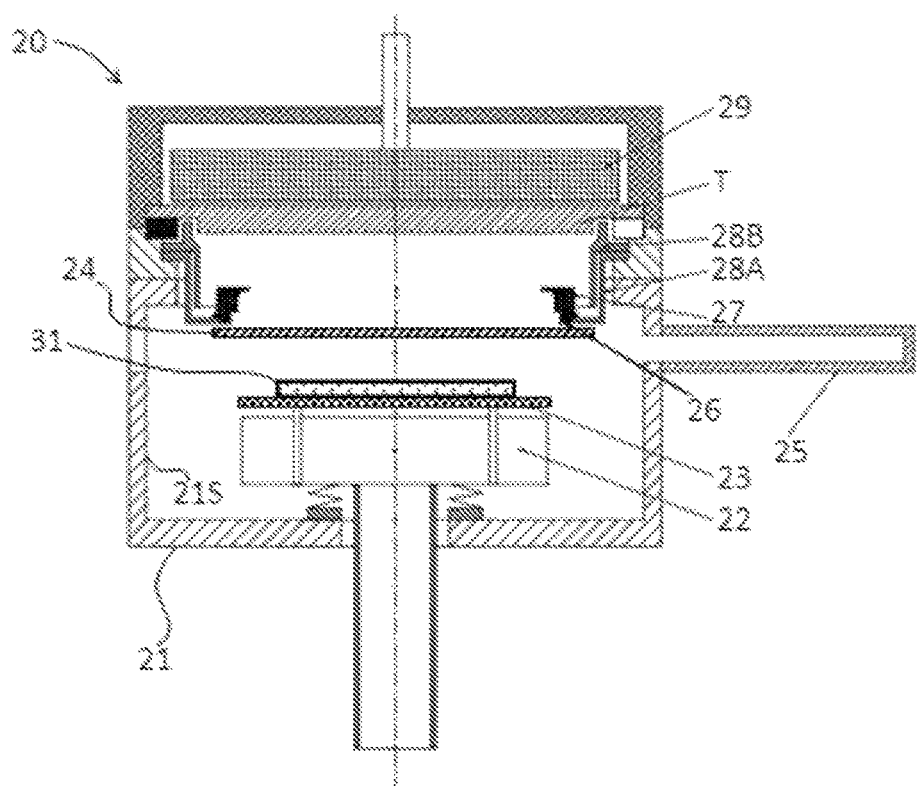
FIG. 2B is a schematic diagram of a film forming method for a semiconductor device provided in some embodiments of the present disclosure.
Figure 2C:
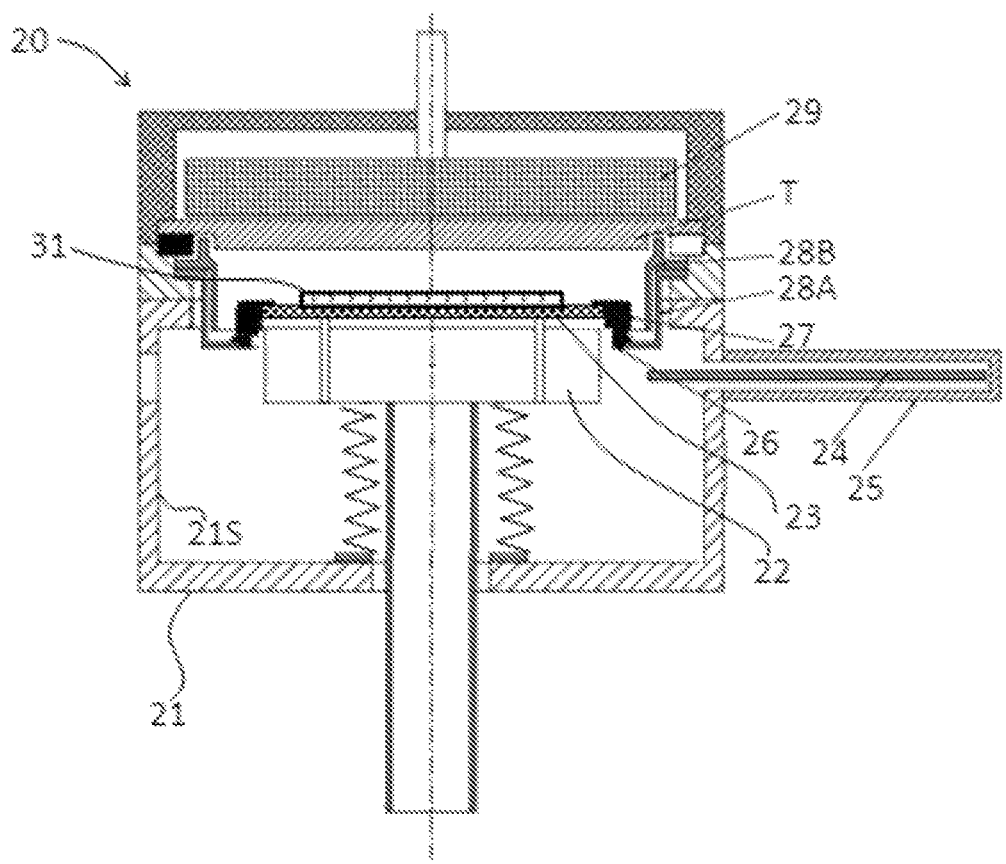
FIG. 2C is a schematic diagram of a film forming method for a semiconductor device provided in some embodiments of the present disclosure.

FIGS. 2A to 2C are schematic diagrams of a film forming method for a semiconductor device provided in some embodiments of the present disclosure. As shown in FIG. 2A together with FIG. 1, some embodiments of the present disclosure provide a film forming method 100 for a semiconductor device. With reference to FIG. 2A, a sputtering device 20 may be provided. The sputtering device 20 includes one chamber 21, one carrying base 22 and one shielding plate 24. In some embodiments, the sputtering device 20 may further include a shielding plate depository 25 for receiving the shielding plate 24, a heat isolation ring 26, a covering ring 27, a lower cover 28A, an upper cover 28B, and a magnetron 29. The shielding plate depository 25 penetrates through an inner wall 21S of the chamber 21 to communicate with the inside of the chamber 21, but it is not limited thereto. In other embodiments of the present disclosure, other required component(s) may be provided inside and/or outside the sputtering device 20 as required. A sputtering route SR is performed with the sputtering device 20, and the sputtering route SR includes steps 110, 112, 114, 115, 116 and 118. At step 110, a substrate 31 is loaded into the chamber 21 and placed on the carrying base 22. In some embodiments, one batch of substrate(s) 31 (which may be one substrate or a plurality of substrates as stated above) may be first placed on a tray 23, and then the tray 23 on which the substrate(s) 31 are placed is loaded into the chamber 21 and placed on the carrying base 22, for example by a mechanical arm. In some other embodiments, it is also feasible to directly place one batch of substrate(s) 31 onto the carrying base 22 instead of using the tray 23.

In some embodiments, the substrate 31 may be a sapphire substrate, or a substrate formed by silicon carbide (SiC) or other proper material, such as a semiconductor substrate, a silicon-on-insulator (SOI) substrate, a glass substrate or a ceramic substrate, and the tray 23 may be made of, for example, silicon carbide (SiC) or molybdenum, but it is not limited thereto.

As shown in FIG. 2B together with FIG. 1, at step 112, the shielding plate 24 is moved to a position between a target T and the substrate 31, and at step 114, an inert gas is introduced into the chamber 21 to perform a surface modification process on the target T. In the surface modification process, ions generated by the inert gas will bombard the target T, so as to modify a surface quality of the target T. For example, a film layer formed on the surface of the target T due to the previous sputtering route is removed. In one instance of the surface modification process, an inert gas, such as argon, may be introduced at a flow rate between 100 sccm (standard cubic centimeter per minute) and 300 sccm, and preferably between 180 sccm and 280 sccm, but it is not limited thereto. In addition, in the surface modification process, a sputtering power supplied to the target T may be between 2500 watts and 4000 watts, and preferably between 2800 watts and 3500 watts, but is not limited thereto. In some embodiments, only an inert gas, such as argon, may be introduced into the chamber 21 and no other reaction gas is introduced.

In some embodiments, the shielding plate 24 may be placed in the shielding plate depository 25 when the surface modification process is not performed yet. Prior to performing the surface modification process, the shielding plate 24 may be moved into the chamber 21 from the shielding plate depository 25 and is located between the target T and the substrate 31, and the surface modification process is performed. During the surface modification process, the shielding plate 24 is also located between the target T and the substrate 31 to avoid material of the target T from being formed on the substrate 31 in the surface modification process. In other words, the shield plate 24 may be considered as a baffle for preventing particles generated during the surface modification process from falling on the substrate 31 or carrying base 22 in order not to influence quality of subsequently formed film. In the present embodiment, the surface modification process is performed after the substrate 31 is loaded into the chamber 21, and the shielding plate 21 is positioned between the target T and the substrate 31 when the surface modification process is being performed, but it is not limited thereto.

Subsequently as shown in FIG. 2B together with FIG. 1, at step 115, a pre-sputtering is performed to pre-treat the surface of the target T. The pre-sputtering can further treat the surface of the target T subjected to the surface modification to a transition state. The pre-sputtering may include introducing an inert gas and a reaction gas into the chamber 21, wherein the inert gas may be, for example, argon (Ar), while the reaction gas may be chosen according to material of a to-be-formed film layer. In some embodiments, the gas introduced during the pre-sputtering may be the same as gas introduced during a main sputtering performed subsequently, which is not limited to this. In one instance, during the pre-sputtering, the reaction gas is introduced at a flow rate between 30 sccm and 300 sccm, and preferably between 100 sccm and 220 sccm; and the inert gas, such as argon, is introduced at a flow rate between 15 sccm and 100 sccm, and preferably between 20 sccm and 70 sccm. In addition, during the pre-sputtering, sputtering power loaded to the target T may include a pulse DC power having a power in the range of 2500 watts to 4000 watts, and preferably between 2800 watts and 3500 watts, but this is not limited.

As shown in FIG. 2C together with FIG. 1, at step 116, the shielding plate 24 is moved away from a position between the target T and the substrate 31, and the main sputtering is performed on the substrate 31 to form a film on the substrate 31 by means of the target T. The main sputtering may include introducing an inert gas and a reaction gas in the chamber 21, wherein the inert gas may be, for example, argon (Ar), while the reaction gas may be chosen according to material of a to-be-formed film layer. Ions (e.g., Ar ions)

generated from the inert gas bombard the target T, and the target T reacts with the reaction gas to form a film layer on the substrate 31. In one instance, during the main sputtering, the reaction gas is introduced at a flow rate between 30 sccm and 300 sccm, and preferably between 100 sccm and 220 sccm; and the inert gas, such as argon, is introduced at a flow rate between 15 sccm and 100 sccm, and preferably between 20 sccm and 70 sccm. In addition, during the main sputtering, sputtering power loaded to the target T may include a pulse DC power having a power in the range of 2500 watts to 4000 watts, and preferably between 2800 watts and 3500 watts, but this is not limited. At step 118, the substrate 31 on which the film is formed is moved out of the chamber 21. In some embodiments, the sputtering power loaded to the target T during the pre-sputtering is equal to the sputtering power loaded to the target T during the main sputtering, but this is not limited.

The steps 110, 112, 114, 115, 116 and 118 may be performed repeatedly to complete a next sputtering route SR, and the next sputtering route SR corresponds to another batch of substrate(s) 31. One sputtering route SR refers to a route including the steps in which the surface modification process is performed after a tray on which one batch of substrate(s) 31 is placed is loaded into the chamber 21, the main sputtering is performed on the batch of substrate(s) 31 on the tray 23 to form a film, and the tray 23 and the batch of substrate(s) 31 are moved out of the chamber 21.

The film forming method for a semiconductor device in the present embodiment includes performing multiple sputtering routes SR sequentially, and each sputtering route SR processes one batch of substrate(s) to form a film on each surface of the batch of substrate(s). The so-called "one batch of substrate(s)" refers to all of the substrate(s) processed in each sputtering route SR, and may include one substrate or a plurality of substrates. The surface modification process of the sputtering route performed on an N-th batch of substrate(s) and the surface modification process of the sputtering route performed on a (N+1)-th batch of substrate(s) have at least one different process parameter, where N is a positive integer. With the above method, the problem of continuous deviation of film thickness distribution towards a same direction, resulted from pollution or defect generated on a surface of the target after performing multiple sputtering routes respectively on multi-batch substrates without performing surface modification, can be alleviated and further, the film thickness uniformity can be improved.

In some embodiments, different process parameters between the surface modification process of the sputtering route performed on the N-th batch of substrate(s) and the surface modification process of the sputtering route performed on the (N+1)-th batch of substrate(s) may be achieved by applying different process times. For example, the surface modification process of the sputtering route performed on the N-th batch of substrate(s) has a first process time, while the surface modification process of the sputtering route performed on the (N+1)-th batch of substrate(s) has a second process time different form the first process time, and the second process time is approximately 2 to 8 times of the first process time. For example, the first process time is approximately 1~3 seconds, while the second process time is approximately 6~8 seconds, but this is not limited. In addition, under the premise that the surface modification process of the sputtering route performed on the N-th batch of substrate(s) and the surface modification process of the sputtering route performed on the (N+1)-th batch of substrate(s) have different process times, the surface modification process of the sputtering route performed on the N-th batch of substrate(s) and the surface modification process of the sputtering route performed on the (N+1)-th batch of substrate(s) may have a same sputtering power. In some other embodiments, the surface modification process of the sputtering route performed on the N-th batch of substrate(s) and the surface modification process of the sputtering route performed on the (N+1)-th batch of substrate(s) may have different process times and different sputtering power. In some other embodiments, the surface modification process of the sputtering route performed on the N-th batch of substrate(s) and the surface modification process of the sputtering route performed on the (N+1)-th batch of substrate(s) may have different sputtering power but a same process time. In some other embodiments, the surface modification process of the sputtering route performed on the N-th batch of substrate(s) and the surface modification process of the sputtering route performed on the (N+1)-th batch of substrate(s) may have other different process parameters.

In the present embodiment, by adopting different process parameters in the surface modification processes of different sputtering routes, condition of the target can be stabilized, thereby improving film quality and film thickness uniformity. In some embodiments, the method 100 may further include performing a pasting process before and/or after the sputtering route is repeated continuously for multiple times (the multiple sputtering routes performed continuously may constitute one batch of sputtering routes). It should be noted that the conventional film forming method does not include performing a surface modification process on the target, so the pasting process must be performed on the target after performing several sputtering routes, wherein process time lasts tens of minutes. It does not greatly increase the overall process time, but also requires a high power (higher than 4500 watts), resulting in a short life time of the target to be approximately 3 months to 6 months. By contrast, in the film forming method of the present disclosure, different process parameters are adopted in different sputtering routes to perform the surface modification processes on the target T, and the surface modification process has a process time of only several seconds to improve the condition of the target T. In a case where the target T is in good condition, the method of the present disclosure, compared with the conventional film forming method, can decrease the number and frequency running the pasting process, thus the overall process time can be shortened, and furthermore, the pasting process of the present disclosure only requires a low power approximately between 2500 watts and 4000 watts to be loaded to the target T. That is, the life time of the target T can be prolonged to 1 to 2 years.

In some embodiments, the film forming method 100 for a semiconductor device may be used for forming a non-metal film, a metal film or a metallic compound film. For example, in a case where the film to be formed on the substrate 31 is an aluminum nitride (AlN) film, the target T may be a target containing aluminum, such as a pure aluminum target or an aluminum nitride target, and the above method 100 may be considered as an aluminum nitride film forming method for a semiconductor device.

In addition, when forming the aluminum nitride film, the pre-sputtering described above may include introducing, into the chamber 21, a gas containing nitrogen and an inert gas, such as argon or the like, and bombarding the target containing aluminum (i.e., the target T) using ions generated by the inert gas such that a surface of the target is changed from an aluminum-rich (Al-rich) state into a transition state. In one instance, during the pre-sputtering, the gas containing nitrogen (e.g., nitrogen gas) is introduced at a flow rate between 30 sccm and 300 sccm, and preferably between 100 sccm and 220 sccm; and the inert gas (e.g., argon) is introduced at a flow rate between 15 sccm and 100 sccm, and preferably between 20 sccm and 70 sccm, but this is not limited. In addition, during the pre-sputtering, sputtering power loaded to the target T may include a pulse DC power having a power in the range of 2500 watts to 4000 watts, and preferably between 2800 watts and 3500 watts, but this is not limited. In some embodiments, during the pre-sputtering, a gas containing oxygen may be additionally introduced into the chamber 21, so that the surface of the target T has oxygen dopant (may also be considered as aluminum oxynitride, AlON). In one instance, the gas containing oxygen (e.g., oxygen gas) is introduced at a flow rate between 0.5 sccm and 10 sccm, and preferably between 0.5 sccm and 5 sccm, but this is not limited.

When forming the aluminum nitride film, the main sputtering described above may include introducing, into the chamber 21, a gas containing nitrogen and an inert gas, such as argon (Ar), causing ions (Ar ions) generated by the inert gas to bombard the target containing aluminum (i.e., the target T) and react with the gas containing nitrogen to form the aluminum nitride film on the substrate 31. In some embodiments, during the main sputtering, a gas containing oxygen may be additionally introduced into the chamber 21, so that the formed aluminum nitride film may include oxygen-doped aluminum nitride film. For example, during the main sputtering, the gas containing nitrogen (e.g., nitrogen gas) is introduced at a flow rate between 30 sccm and 300 sccm, and preferably between 100 sccm and 220 sccm; the inert gas (e.g., argon) is introduced at a flow rate between 15 sccm and 100 sccm, and preferably between 20 sccm and 70 sccm; and the gas containing oxygen (e.g., oxygen gas) is introduced at a flow rate between 0.5 sccm and 10 sccm, and preferably between 0.5 sccm and 5 sccm, but this is not limited. In addition, during the main sputtering, sputtering power loaded to the target T may include a pulse DC power having a power in the range of 2500 watts to 4000 watts, and preferably between 2800 watts and 3500 watts, but this is not limited. In some embodiments, the sputtering power loaded to the target T during the pre-sputtering is equal to the sputtering power loaded to the target T during the main sputtering, but this is not limited.

In some embodiments, the surface modification process may also include introducing, into the chamber 21, an inert gas, such as argon only, without introducing any reaction gas, such as a gas containing nitrogen and a gas containing oxygen, and bombarding the target containing aluminum (i.e., the target T) using ions generated by the inert gas, so as to modify the surface of the target T. For example, aluminum nitride formed on the surface of the target T due to the previous process is at least partially removed. For example, during the surface modification process, the inert gas (e.g., argon) may be introduced at a flow rate between 100 sccm and 300 sccm, and preferably between 180 sccm and 280 sccm, but this is not limited. In addition, during the surface modification process, sputtering power loaded to the target T may be between 2500 watts and 4000 watts, and preferably between 2800 watts and 3500 watts, but this is not limited. In some embodiments, a sputtering power may be continuously loaded to the target T during the pre-sputtering and the main sputtering, that is, the pre-sputtering and the main sputtering are performed in a continuously igniting manner (i.e., it is ignited in the chamber 21).

As described above, the method of the present disclosure performs the surface modification process on the target T in every sputtering route, and the surface modification processes of the sputtering routes respectively corresponding to different batches of substrates adopt different process parameters, so that the condition inside the chamber 21 and the condition of the target T can be stabilized. Further, adverse influence on film thickness uniformity, generated in the multiple sputtering routes where no surface modification process is performed on the target T or the target T is processed applying surface modification processes with same process parameters, can be compensated, thereby improving film quality and film thickness uniformity. Examples are given in Table 1 and Table 2 as follows. Table 1 shows thickness conditions of aluminum nitride films formed using a method of a comparative example (in which no surface modification process is performed in each sputtering route), and in each sputtering route, the main sputtering is performed on 5 substrates placed on the tray (i.e., each batch of substrates include 5 substrates); Table 2 shows thickness conditions of aluminum nitride films formed using the method 100 provided by the present disclosure, and in each sputtering route, the main sputtering is performed on 5 substrates placed on the tray (i.e., each batch of substrates include 5 substrates). It can be known from the results shown in Tables 1 and 2 that, the thickness uniformities of the aluminum nitride films formed using the method of the present disclosure are obviously better than the thickness uniformities of the aluminum nitride films formed using the method of the comparative example. In addition, the above-described sputtering route of the present disclosure is performed continuously for 20 times, and the results show that for each batch of substrates, each substrate has very good film thickness uniformity, and the film thickness uniformity among different substrates is also very good. Moreover, for different batches of substrates, the film thickness uniformity among different batches is also improved. In other words, the surface modification process performed on the target in the film forming method of the present disclosure can effectively improve film thickness uniformity.

TABLE 1

|  | Substrate No. | Thickness (Å) | Non-uniformity within a single substrate | Non-uniformity among substrates |
|---|---|---|---|---|
| 1st tray | 1 | 376.2 | 0.79% | 1.59% |
|  | 2 | 362.5 | 0.67% |  |
|  | 3 | 367.8 | 0.75% |  |
|  | 4 | 372.5 | 0.84% |  |
|  | 5 | 376.2 | 0.97% |  |
| 20th tray | 1 | 364.0 | 1.26% | 3.39% |
|  | 2 | 345.6 | 1.33% |  |
|  | 3 | 349.4 | 1.27% |  |
|  | 4 | 366.6 | 1.44% |  |
|  | 5 | 374.7 | 1.65% |  |

TABLE 2

|  | Substrate No. | Thickness (Å) | Non-uniformity within a single substrate | Non-uniformity among substrates |
|---|---|---|---|---|
| 1st tray | 1 | 365.8 | 0.70% | 0.20% |
|  | 2 | 366.7 | 0.38% |  |
|  | 3 | 366.9 | 0.29% |  |
|  | 4 | 367.8 | 0.33% |  |
|  | 5 | 367.1 | 0.44% |  |
| 20th tray | 1 | 355.7 | 0.91% | 0.21% |
|  | 2 | 355.2 | 0.66% |  |
|  | 3 | 355.1 | 0.54% |  |

TABLE 2-continued

| Substrate No. | Thickness (Å) | Non-uniformity within a single substrate | Non-uniformity among substrates |
|---|---|---|---|
| 4 | 356.6 | 0.49% | |
| 5 | 356.7 | 0.65% | |

Figure 3:
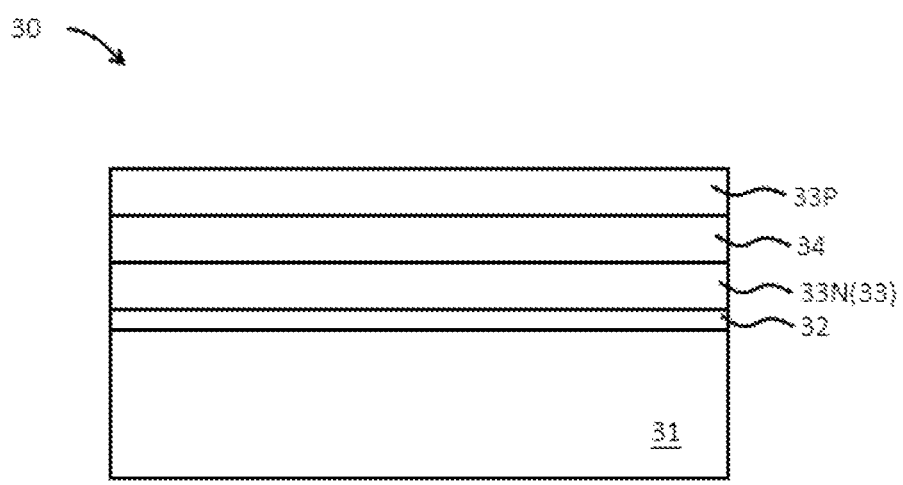
FIG. 3 is a schematic diagram of an electronic device in some embodiments of the present disclosure.

In addition, referring to FIGS. 1, 2C and 3, FIG. 3 is a schematic diagram of an electronic device in some embodiments of the present disclosure. As shown in FIGS. 1, 2C and 3, in some embodiments, the aluminum nitride film forming method 100 for a semiconductor device may be used for forming an aluminum nitride buffer layer 32 in an electronic device 30, such as a gallium nitride based light emitting diode (GaN-based LED) device. In some embodiments, the electronic device 30 may include a substrate 31, an aluminum nitride buffer layer 32 and a gallium nitride layer 33. The aluminum nitride buffer layer 32 is formed on the substrate 31, and the gallium nitride layer 33 is formed on the aluminum nitride buffer layer 32. The aluminum nitride buffer layer 32 may be formed on the substrate 31 using the above method 100, and the gallium nitride layer 33 may be formed on the aluminum nitride buffer layer 32. Because lattice mismatch and thermal mismatch degrees between the aluminum nitride buffer layer 32 and the substrate 31 (e.g., a sapphire substrate) are relatively small, the aluminum nitride buffer layer 32 can be used for improving quality of the gallium nitride layer 33 subsequently formed on the aluminum nitride buffer layer 32 by epitaxy, which in turn improves performance of the electronic device 30. For example, the electronic device 30 may include a light emitting diode device and other suitable semiconductor electronic device. In a case where the electronic device 30 is a GaN-based LED device, the electronic device 30 may further include a quantum well layer 34 formed on the gallium nitride layer 33, and in this case, the gallium nitride layer 33 may be treated to become an N-type doped gallium nitride layer 33N, and a P-type doped gallium nitride layer 33P may be formed on the quantum well layer 34, but this is not limited. By introducing oxygen during the main sputtering in forming the aluminum nitride buffer layer 32, the film quality of the gallium nitride layer 33 subsequently formed on the aluminum nitride buffer layer 32 can be improved, and various electrical performance of the electronic device 30 (e.g., an LED device) can be improved as well.

In summary, in the film forming method for a semiconductor device of the present disclosure, different process parameters are adopted in the surface modification processes of different sputtering routes performed on multi-batch substrates, so that the condition inside the chamber and the condition of the target can be stabilized. Further, adverse influence on film thickness uniformity, generated under the condition where no surface modification process is performed on the target in the sputtering route, can be compensated, thereby improving film quality and film thickness uniformity. With the film forming method for a semiconductor device of the present disclosure for forming an aluminum nitride film, because both the film quality and the thickness uniformity of the aluminum nitride film are improved, the epitaxy quality of the gallium nitride layer subsequently formed on the aluminum nitride film is also improved.

The foregoing contents describe features of some implementations, so that a person of ordinary skill in the art can better understand various aspects of the disclosed contents of the present application. A person of ordinary skill in the art should understand that other process(es) or structure(s) may be readily designed or modified, on the basis of the disclosed contents of the present application, to achieve the same object(s) and/or advantage(s) as the implementations described in the present application. A person of ordinary skill in the art should also understand that the equivalent configurations do not depart from the spirit and scope of the disclosed contents of the present application, and a person of ordinary skill in the art can make various modifications, replacements and alternatives without departing from the spirit and scope of the disclosed contents of the present application.

What is claimed is:

1. A film forming method for a semiconductor device, comprising:
    performing multiple sputtering routes to form films on multi-batch substrates, wherein each sputtering routes comprises:
        loading a substrate into a chamber;
        moving a shielding plate between a target and the substrate;
        introducing an inert gas into the chamber to perform a surface modification process on the target;
        performing a pre-sputtering to pre-treat a surface of the target;
        moving the shielding plate away from the substrate, and performing a main sputtering to form a film on the substrate; and
        moving the substrate out of the chamber;
    wherein:
        the surface modification process of the sputtering routes performed on an N-th batch of substrate and the surface modification process of the sputtering routes performed on a (N+1)-th batch of substrate have at least one different process parameter, where N is a positive integer, and
        the surface modification processes corresponding to the sputtering routes performed on odd-numbered batches of substrates have an identical process parameter.

2. The method according to claim 1, wherein: the inert gas introduced during the surface modification process comprises argon.

3. The method according to claim 1, wherein: the surface modification process of the sputtering routes performed on the N-th batch of substrate has a first process time, and the surface modification process of the sputtering routes performed on the (N+1)-th batch of substrate has a second process time different from the first process time.

4. The method according to claim 3, wherein: the second process time is 2 to 8 times of the first process time.

5. The method according to claim 3, wherein: the first process time is 1~3 seconds, and the second process time is 6~8 seconds.

6. The method according to claim 3, wherein: the surface modification process of the sputtering routes performed on the N-th batch of substrate and the surface modification process of the sputtering routes performed on the (N+1)-th batch of substrate have a same sputtering power.

7. The method according to claim 1, wherein: the surface modification process of the sputtering routes performed on the N-th batch of substrate and the surface modification process of the sputtering routes performed on the (N+1)-th batch of substrate have different sputtering power.

8. The method according to claim 7, wherein: the surface modification process of the sputtering routes performed on the N-th batch of substrate and the surface modification process of the sputtering routes performed on the (N+1)-th batch of substrate have a same process time.

9. The method according to claim 1, wherein: the surface modification process of the sputtering routes performed on the N-th batch of substrate and the surface modification process of the sputtering routes performed on the (N+1)-th batch of substrate have different process times and sputtering power.

10. The method according to claim 1, wherein: the gas introduced during the pre-sputtering and the gas introduced during the main sputtering are identical.

11. The method according to claim 1, further comprising continuously applying a sputtering power to the target during the pre-sputtering and the main sputtering.

12. The method according to claim 1, further comprising:
repeating the sputtering routes continuously for multiple times, wherein the multiple sputtering routes performed continuously constitute one batch of sputtering routes; and
performing a pasting process at least one of after said one batch of sputtering routes and before said one batch of sputtering routes, wherein a power applied to the target is between 2500 watts and 4000 watts during the pasting process.

13. An aluminum nitride film forming method for a semiconductor device, comprising:
performing multiple sputtering routes to form aluminum nitride films on multi-batch substrates, wherein each sputtering routes comprises:
loading a substrate into a chamber;
moving a shielding plate between a target containing aluminum and the substrate;
introducing an inert gas into the chamber to perform a surface modification process on the target containing aluminum;
performing a pre-sputtering to pre-treat a surface of the target containing aluminum such that the surface of the target containing aluminum is changed into a transition state from an Al-rich state;
moving the shielding plate away from the substrate, introducing an inert gas and a gas containing nitrogen into the chamber, and performing a main sputtering to form an aluminum nitride film on the substrate using the target containing aluminum; and
moving the substrate out of the chamber;
wherein:
the surface modification process of the sputtering routes performed on an N-th batch of substrate and the surface modification process of the sputtering routes performed on a (N+1)-th batch of substrate have at least one different process parameter, where N is a positive integer, and
the surface modification processes corresponding to the sputtering routes performed on odd-numbered batches of substrates have an identical process parameter.

14. The method according to claim 13, wherein: the surface modification process of the sputtering routes performed on the N-th batch of substrate has a first process time, and the surface modification process of the sputtering routes performed on the (N+1)-th batch of substrate has a second process time different from the first process time.

15. The method according to claim 13, wherein: the surface modification process of the sputtering routes performed on the N-th batch of substrate and the surface modification process of the sputtering routes performed on the (N+1)-th batch of substrate have different sputtering power.

16. The method according to claim 13, wherein: the surface modification process of the sputtering routes performed on the N-th batch of substrate and the surface modification process of the sputtering routes performed on the (N+1)-th batch of substrate have different process times and sputtering power.

17. The method according to claim 13, wherein: the main sputtering further comprises introducing a gas containing oxygen into the chamber so that the aluminum nitride film includes oxygen dopant.

18. The method according to claim 13, further comprising continuously applying a sputtering power to the target containing aluminum during the pre-sputtering and the main sputtering.

19. The method according to claim 13, wherein: a sputtering power applied to the target containing aluminum during the pre-sputtering is equal to a sputtering power applied to the target containing aluminum during the main sputtering.

20. The method according to claim 13, further comprising:
repeating the sputtering routes continuously for multiple times, wherein the multiple sputtering routes performed continuously constitute one batch of sputtering routes; and
performing a pasting process at least one of after said one batch of sputtering routes and before said one batch of sputtering routes, wherein a power applied to the target containing aluminum is between 2500 watts and 4000 watts during the pasting process.

* * * * *